United States Patent [19]
Tsai et al.

[11] Patent Number: 5,437,931
[45] Date of Patent: Aug. 1, 1995

[54] OPTICALLY VARIABLE MULTILAYER FILM AND OPTICALLY VARIABLE PIGMENT OBTAINED THEREFROM

[75] Inventors: Rung-Ywan Tsai, Kaohsiung; Chaur-Tsang Wei; Chii-Hua Lee, both of Taipei; Fang-Chuan Ho, Hsinchu; Gi-Horng Chuang, Niantou, all of Taiwan

[73] Assignee: Industrial Technology Research Institute, Chutung, Taiwan

[21] Appl. No.: 139,524

[22] Filed: Oct. 20, 1993

[51] Int. Cl.6 .................................................. B32B 9/04
[52] U.S. Cl. ..................................... 428/446; 428/195; 428/209; 428/448; 428/450
[58] Field of Search .................. 106/22, 415; 428/403, 428/328, 329, 330, 331, 404, 412, 480, 913, 916, 446, 448, 450, 195, 209

[56] References Cited

U.S. PATENT DOCUMENTS

| | | | |
|---|---|---|---|
| 3,858,977 | 1/1975 | Baird et al. | 356/71 |
| 4,779,898 | 10/1988 | Berning et al. | 283/39 |
| 5,007,689 | 4/1991 | Kelly et al. | 350/1.6 |
| 5,059,245 | 10/1991 | Phillips et al. | 106/22 |
| 5,084,351 | 1/1992 | Philips et al. | 428/411.1 |
| 5,135,812 | 8/1992 | Phillips et al. | 428/403 |
| 5,171,363 | 12/1992 | Phillips et al. | 106/22 R |
| 5,248,544 | 9/1993 | Kaule | 428/195 |
| 5,279,657 | 1/1994 | Phillips et al. | 106/22 R |
| 5,281,480 | 1/1994 | Phillips et al. | 428/412 |

*Primary Examiner*—Patrick J. Ryan
*Assistant Examiner*—William A. Krynski
*Attorney, Agent, or Firm*—Merchant, Gould, Smith, Edell, Welter & Schmidt

[57] ABSTRACT

An optically variable pigment being formed from optically variable flakes. The optically variable multilayer is vacuum deposited onto a flexible polyester substrate having being provided with a release layer. An optically variable stack is formed from an opaque metallic reflective layer and two sub-unit film stacks D'MD symmetrically stacked on the opposite surfaces of the metallic reflective layer. D is adjacent to the reflective layer and is a color-presenting layer and D' is an outer layer of the stack which is used to protect the multilayer film to obtain better color-presenting. M is a semitransparent metallic layer, e.g. chromium.

5 Claims, 9 Drawing Sheets

PRIOR ART

OPTICALLY VARIABLE MULTILAYER FILM AND OPTICALLY VARIABLE PIGMENT OBTAINED THEREFROM

BACKGROUND OF THE INVENTION

The present, invention relates to an optically variable multilayer film and an optically variable pigment obtained therefrom. The pigment can be mixed with resin or varnish to form color-variable ink or paints so as to be used widely in everyday life.

Optically variable multilayer film is a film which varies colors with the incident angle of light upon the coating. Due to such a characteristic, they have been widely used in advertising boards, documentations and marking labels for anti-counterfeiting and for beautiful purpose.

In the past, attempts making uses of an optical interference technique to provide anti-counterfeiting of valuable stocks have been disclosed in U.S. Pat. No. 3,858,977 (issued to Baird et al). The prior art discloses an optical interference coating comprising a substrate having a colored surface and filter composed of optical multilayers. The color of the filter is varied with the angle of incidence of light onto the filter. The purpose of the colored substrate is to absorb certain light which passed through the filter. In addition, the external surface of the filter is coated with a layer of transparent or colored protective coating. However, this prior art does not disclose the making of pigment or ink with variable colors from the use of optical interference coating film. As a result, the applications of the prior art are rather limited.

U.S. Pat. No. 4,779,898 discloses an optically variable multilayer film coated on an opaque paper currency to achieve an anti-counterfeiting purpose.

The film in the U.S. Patent is deposited with a yellow color hardcoat on the surface. The hardcoat is an acrylic-type polymer added with yellow dye. The major function of the hardcoat is to absorb high angle reflective light of the optical interference coating, such that the coated film varies colors with respect to the incidence light to perform two colors variation. However, the prior art does not disclose the method of forming pigment from the optical interference coating. As a result, the utilization of the prior patent is also rather limited.

U.S. Pat. No. 5,084,351 discloses various applications of an optical interference coated film on anti-counterfeiting and coating aspects and the manufacturing processes of the color-variable printing ink and the pigment. The film is essentially an opaque reflective layer of which both surfaces are deposited symmetrically with period stacks, respectively, such that both the front and rear surface have same color variation. Each group of the period stacks is formed of a dielectric layer and a semi-transparent metallic layer. In the preparation of optically variable multilayer flakes, in this prior art, the optical interference multilayer is coated onto a soluble or insoluble plastic substrate. If the optical interference multilayer film is deposited onto a soluble plastic substrate and a solvent is used to dissolve the substrate, the separation of the substrate from the flakes can not perform thoroughly. That is, the flakes may contaminate by the substrate. This will cause a changed in optical characteristics of multilayer flakes, and the degree of homogeneity if the flakes are to mix with resin to produce ink. If an insoluble plastic substrate is used, a layer of soluble release layer must be deposited before the optical interference film is coated onto the insoluble substrate. The purpose of this is to separate the optical interference coated film from the plastic substrate under water or other kinds of solvents where the release layer can be dissolved. In U.S. Pat. No. 5,084,351, the material of the release layer is a soluble polymer film, for instance acrylic resin, which can be dissolved in ethanol or sodium chloride coated film, which can be dissolved in water. However, these materials lave shortcomings when in use. For instance if the acrylic resin is used as the release layer, the problem of flakes contamination occurs. If sodium chloride coated film is used, it is time-consuming and uneconomical. Besides, when preparing the flakes, the coated film will be corroded by sodium chloride solution. In addition, in the patent, both of the outmost faces of the flake are thin metallic chromium films (the thickness is 10 nm), they are easily affected (such as oxidization) by ambient environment and lost its original glossiness.

As a result of the above drawbacks, it is an object of the present invention to provide an optically variable multilayer film and the preparation method of flakes from the optically variable multilayer film. In accordance with the present invention, the outermost layer of the optically variable multilayer film is coated with a protective layer which is chemically inert. Such a protective layer causes the optically variable multilayer film flake to be capable of being used as a color variation pigment without degradation for long storage.

Another object of the present invention is to provide an optically variable multilayer film and the preparation method of flakes from the optically multilayer film. The flakes in accordance with the present invention are able to be mixed with resin to form color variable ink or paints without causing the formation of a chemical reaction. By coating this material onto papers, the surface of vehicle, advertising board or documents, label and so on, it provides the function of anti-counterfeiting and decoration.

A further object of the present invention is to provide an optically variable multilayer film and the preparation method of flakes from the optically multilayer film in which the color of the flakes will vary with respect to the incident angle of the incident light. If the angle of incidence is about 60° C., no color is observed (achromazation).

It is yet another object of the present invention to provide an optically variable multilayer film and the preparation method of flakes from the optically variable multilayer film, wherein the flakes adhered to the plastic substrate are separated by the use of a release layer. The release a layer is made of a neutral detergent which is soluble in water or organic solvent and is easily dried, non-sticky but easily released. In addition, the release layer will not react chemically with the optically variable multilayer flakes and is manufactured easily and cost-saving suitable for mass production.

Other features and advantages of this invention will be apparent from a consideration of the detailed description in conjunction with the accompanying drawings.

DETAILED DESCRIPTION OF THE INVENTION

Figure 3:
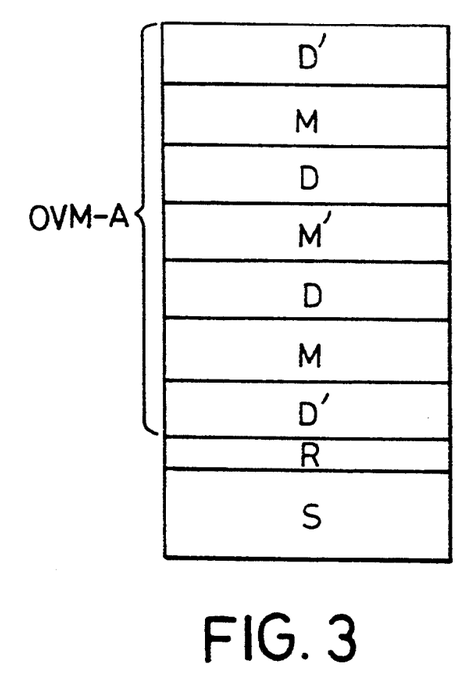
FIG. 3 is a sectional view of an optically variable multilayer film (OVM-A) of the present invention with a SiO$_2$ protective layer.

In accordance with the present invention, FIG. 3 shows the cross-sectional view of an optically variable multilayer film (OVM-A) having a protective layer D'. As shown in the figure, the optically variable multilayer film (OVM-A) is formed onto a substrate S having deposited with a release layer R. The structure is designed with two completely symmetrical D'MD sub-unit film stacks, which are respectively stacked onto the opposite surface of an opaque metallic layer (aluminium layer) M'. The substrate S is an insoluble polyester resin having a thickness of 0.5 mm.

The release layer R is a soluble, neutral detergent, such that it can be dissolved in water or organic solvent so as to make the flakes manufactured from the optically variable film be capable of being separated from the substrate S. In accordance with the present invention, the neutral detergent is available from Merck Co., under the Trade name of 7553 Extran MA 02. Other types of neutral detergent can also be used.

In accordance with the first embodiment of the present invention shown in FIG. 3, the thickness of the metallic aluminium layer M' must be appropriately controlled, for instance 80 nm. This is because pin holes will form on the aluminium layer if the thickness thereof is too high, and besides, the large stress will deteriorate the adhesion force. If the thickness is too thin, the brightness of the reflected color will be lower. The layer M in the sub-unit film stack is a semi-transparent metallic layer such as a chromium layer, with a thickness of about 9 nm. This allows part of the visible light to pass through and part of the visible light to reflect. Layer D is a SiO$_2$ dielectric layer which is used as a color presenting film of which the optical thickness should be controlled to be an integer times the half wavelength of the desired reflected light. In the preferred embodiment, the thickness of the SiO$_2$ color presenting film D is controlled to be the full wavelength of the desired reflected light. For instance, if yellowish orange color is to be obtained as view vertically, then the optical thickness of the SiO$_2$ color presenting film must be controlled at 580 nm. Layer D' is the protective film which must be produced from material with low refractive index, stable to environment and high rigidness or handness such as SiO$_2$. The optical thickness of the protective film D' must be controlled to be $\frac{1}{2}$ wavelength of the required reflected light. The arrangement of the protective layer D' allows the optically variable multilayer (OVM-A) to provide purer colors. As a result, the change of color of the flakes (OVF) produced from the optically variable film (OVM-A) in accordance with the angle of incidence will be more significant. Besides, the addition of SiO$_2$ protective layer will strengthen the resistance against ambient environment, such as the wind, sunlight and rains. This will increase the usage period of the OVF. It is to be noted that the SiO$_2$ protective layer D' is a layer part of the whole optically variable multilayer which is made of the same material as the color presenting film D so that the layers D' and D can be produced in a same vacuum chamber without additional deposition material and step. Therefore, the process of the optically variable film in accordance with the present invention can be simplified and time-saving which is very suitable for mass production.

The advantages of the SiO$_2$ protective layer D$_2$ and the use of neutral detergent as a release layer are explained below by referring to a CIE diagram of FIG. 2.

Figure 1:
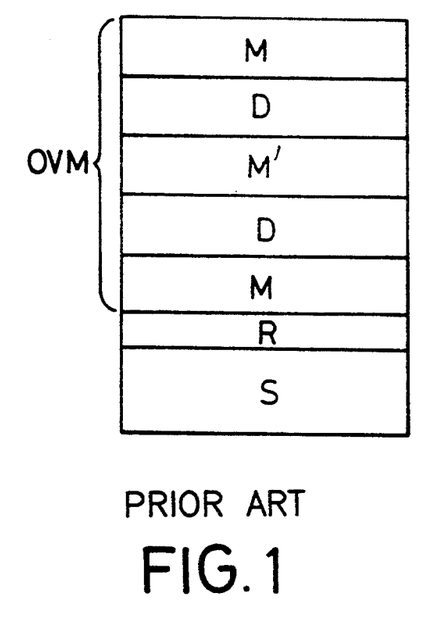
FIG. 1 is a sectional view of a conventional optically variable multilayer film (OVM) without the protective layer of $SiO_2$.
Figure 2:
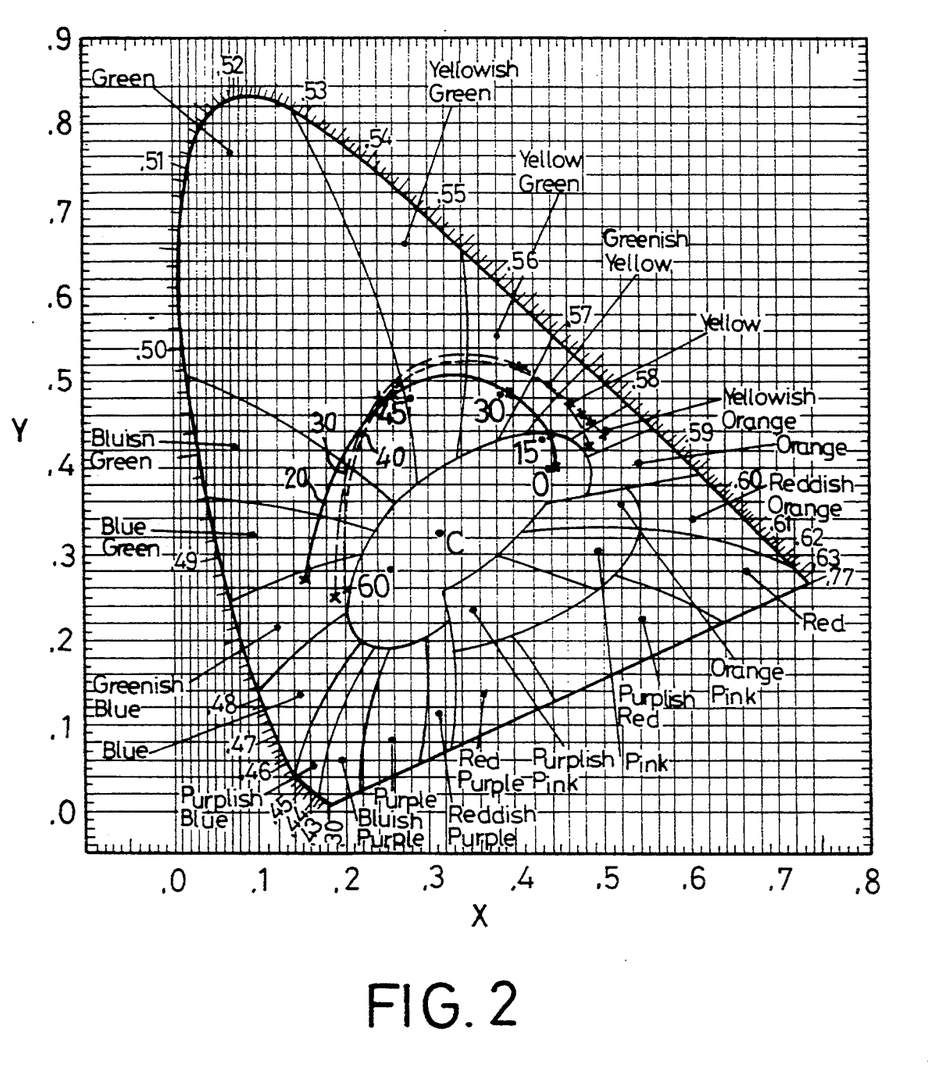
FIG. 2 is a CIE diagram of various types of optically variable multilayer films, wherein curves 30 and 40 are obtained in accordance with the present invention, curve 20 is the CIE curve obtained from the conventional film of FIG. 1.

In FIG. 2, Curves 20 and 30 respectively represent CIE values of the conventional optically variable film (OVM) and that (OVM-A) of the present invention obtained at different angles of incident light (0°, 15°, 30°, 40° and 60°). As shown in the figure, the color of the reflected light varies with respect to the increase of incident angle of light. That is, the incident angle of 0° to 45° and then to 60° the color changes from yellowish orange color to green color and then to greenish blue color. Curves 20 and 30 are changed in similar manner from the distribution of the curves, however, the optically variable multilayer film (OVM-A) (with SiO$_2$ protective layer) provides purer color if the angle of incident light is less than 45°. If the angle of incident light is greater than 45° the color will close to the achromation significantly. As can be noted, the optically variable multilayer film of the present invention has a clearer change in color.

Figure 4:
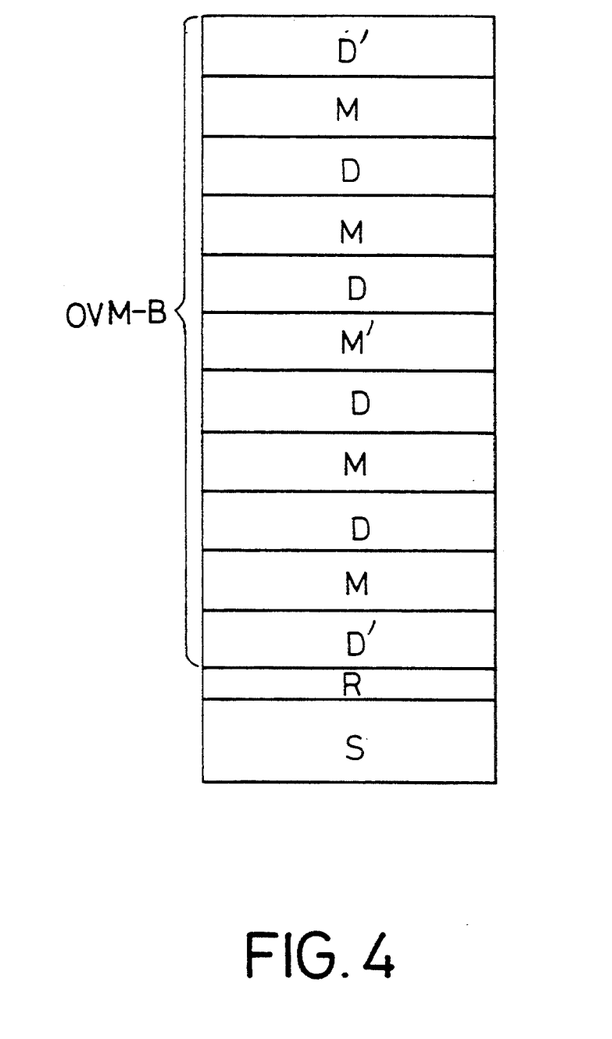
FIG. 4 is a sectional view of another embodiment of an optically variable multilayer film (OVM-B) of the present invention having SiO$_2$ protective layer.

FIG. 4 shows another preferred embodiment of an optically variable multilayer film (OVM-B) in accordance with the present invention. The structure of this embodiment is different with that of FIG. 3. The sub-unit film stack structure is in the form of D'MDMD. The parameters for these layer are shown below.

| layer | material | geometric thickness nm | optical thickness nm | coefficient of refraction $\lambda_0 = 500$ nm |
| --- | --- | --- | --- | --- |
| M' | Al | 80 | | 0.769-6.08i |
| D | SiO$_2$ | 185.86 | 269.5 | 1.45 |
| M | Cr | 6.17 | 12.8 | 2.076-3i |
| D | SiO$_2$ | 205.52 | 298 | 1.45 |
| M | Cr | 11.61 | 24.1 | 2.076-3i |
| D' | SiO$_2$ | 231.1 | 335.1 | 1.45 |
| | Air | | | 1 |

The number of layers of the sub-unit in FIG. 4 is increased, but the total thickness can be made to that of the structure of FIG. 3. Thus, the characteristic will not be affected as a result of the increase in layers. Besides, as a result of increase in number of layers, the color of the film OVM-B at an angle of incident light equal to 15° or smaller than 15° will become purer, and at high angle of incident light (incident angle larger than 60°), the color of the film will lighter (tends to become colorless). As a result, the change of colors will be more significant.

The CIE diagram of the above optically variable multilayer (OVM-B) is shown as curve 40 in FIG. 2. Although at the angle of incident light is 45°, it is similar to that of curves 20 and 30 as green. However, when the incident angle is 0°, the yellowish orange color is purer, and when the incident angle is 60° or above, the color is lighter. As a result, the change of color is obvious as compared to the optically variable multilayer film having no $SiO_2$ protective layer.

Figure 5:
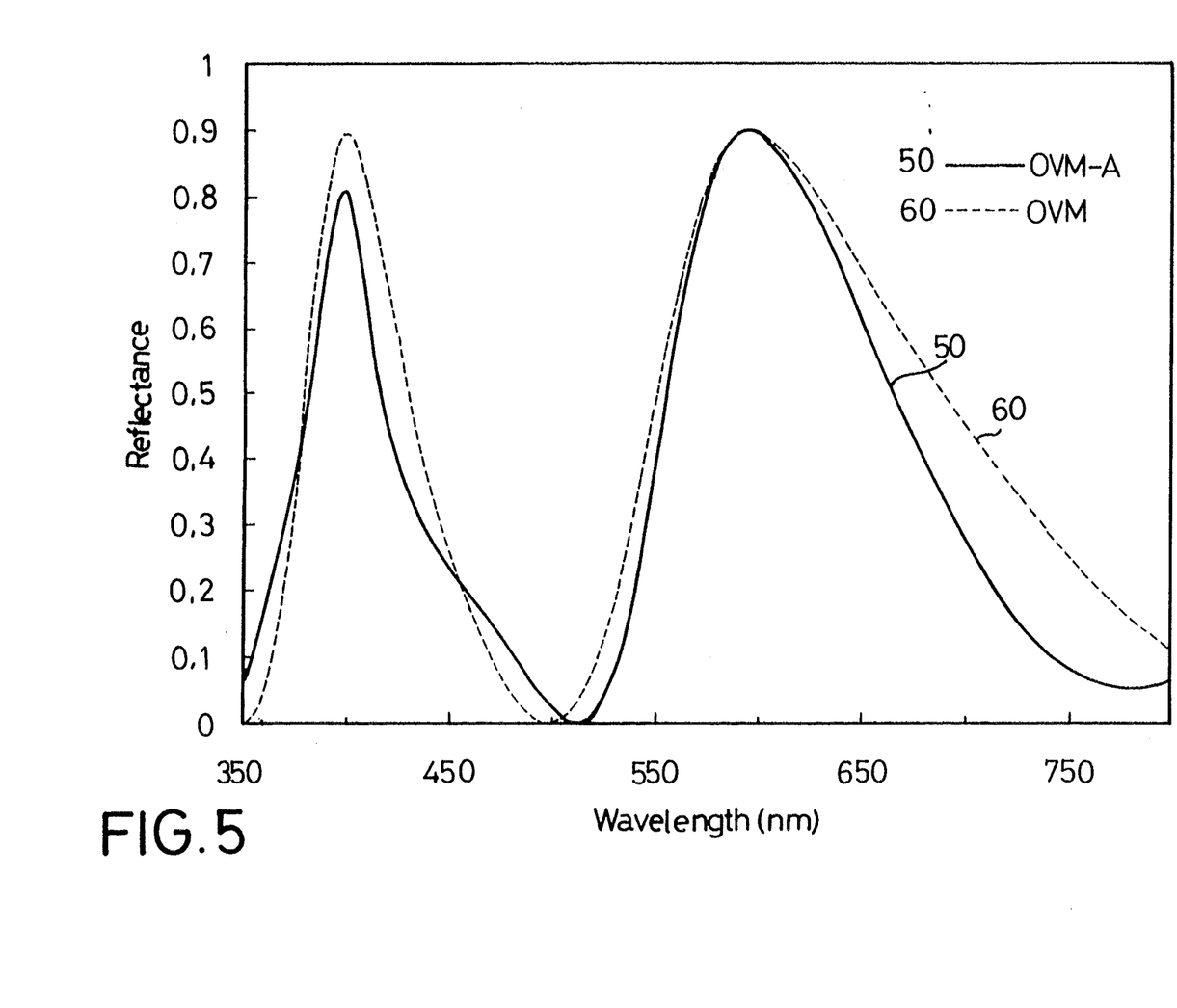
FIG. 5 is the reflection spectra of the optically variable multilayer films of FIGS. 3 and 1 at a near normal incident angle 5°.

The advantages of the present invention are further described based on the reflection spectra of FIG. 5. The curves 60 and 50 of FIG. 5 are the reflection spectra of OVM and OVM-A at near normal incidence (5° angle of incident light). As shown from the diagram, the color change of the OVM-A and that of the conventional OVM is exactly the same. But, the full width of half maximum of the reflected peak of the present invention is narrower than that of the conventional one. From the above, it can thus conclude that the purity of color appearing in the film of the present invention is higher.

Figure 6:
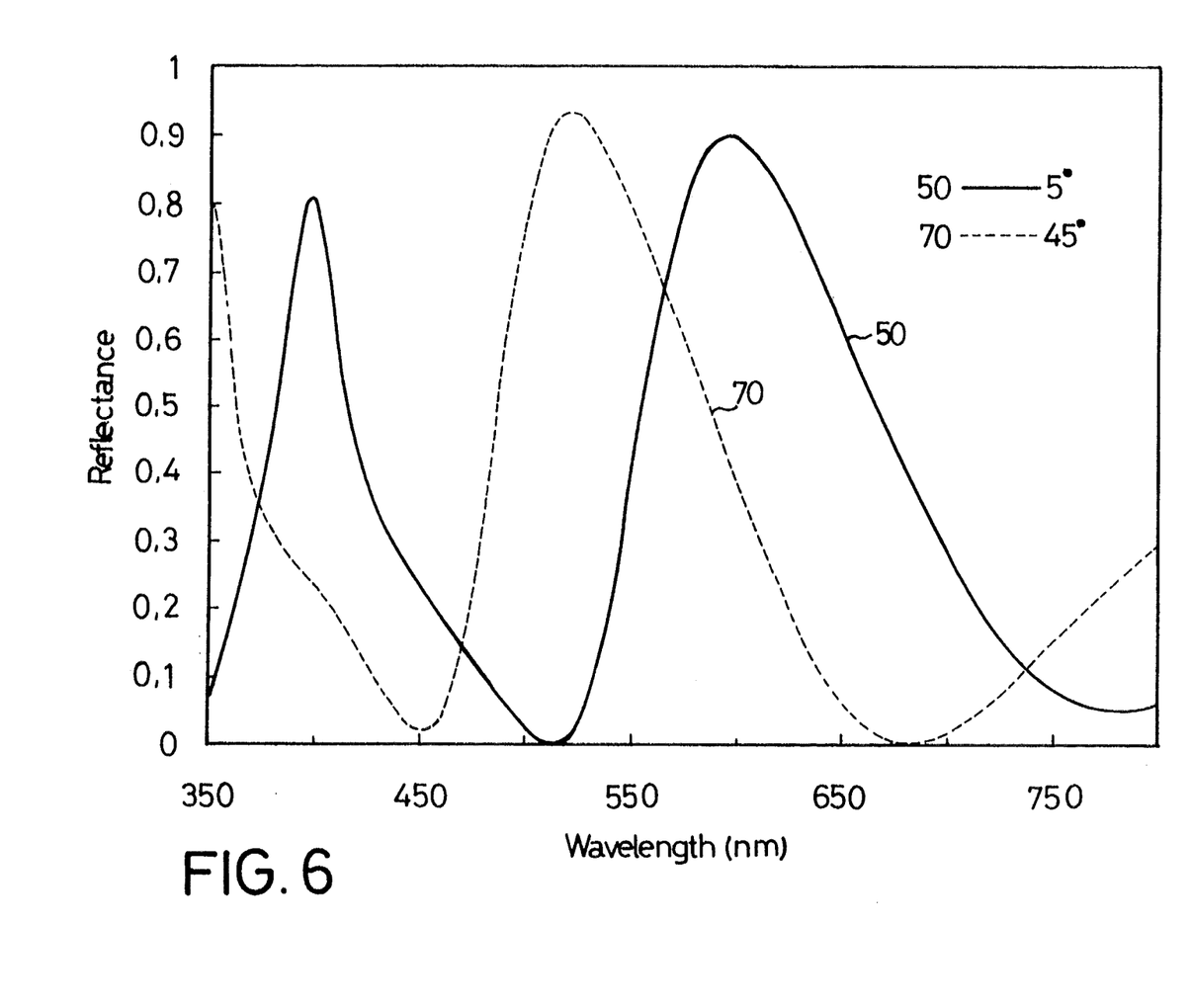
FIG. 6 is the reflection spectra of the optically variable multilayer film (OVM-A) at incident angle of 5° and 45°.

FIG. 6 shows the reflection spectra of the optically variable multilayer (OVM-A) shown in FIG. 3 at angles of incident light of 5° and 45° wherein Curve 50 shows the reflection at the angle of incident light of 5°, and Curve 70 shows the reflection at the angle of incident light of 45°. As shown in the figure, the color of the reflected light of OVM-A at angle of incident light of 5° is yellowish orange. At angle of incident light of 45°, the color is green. It is obvious from the above, there is a significant color different at angle of incident light of 5° and 45°. The common color copy machine cannot attain the function of similar color change. Thus, based on the theory of the present invention, the function of anti-counterfeiting is attained.

Figure 7:
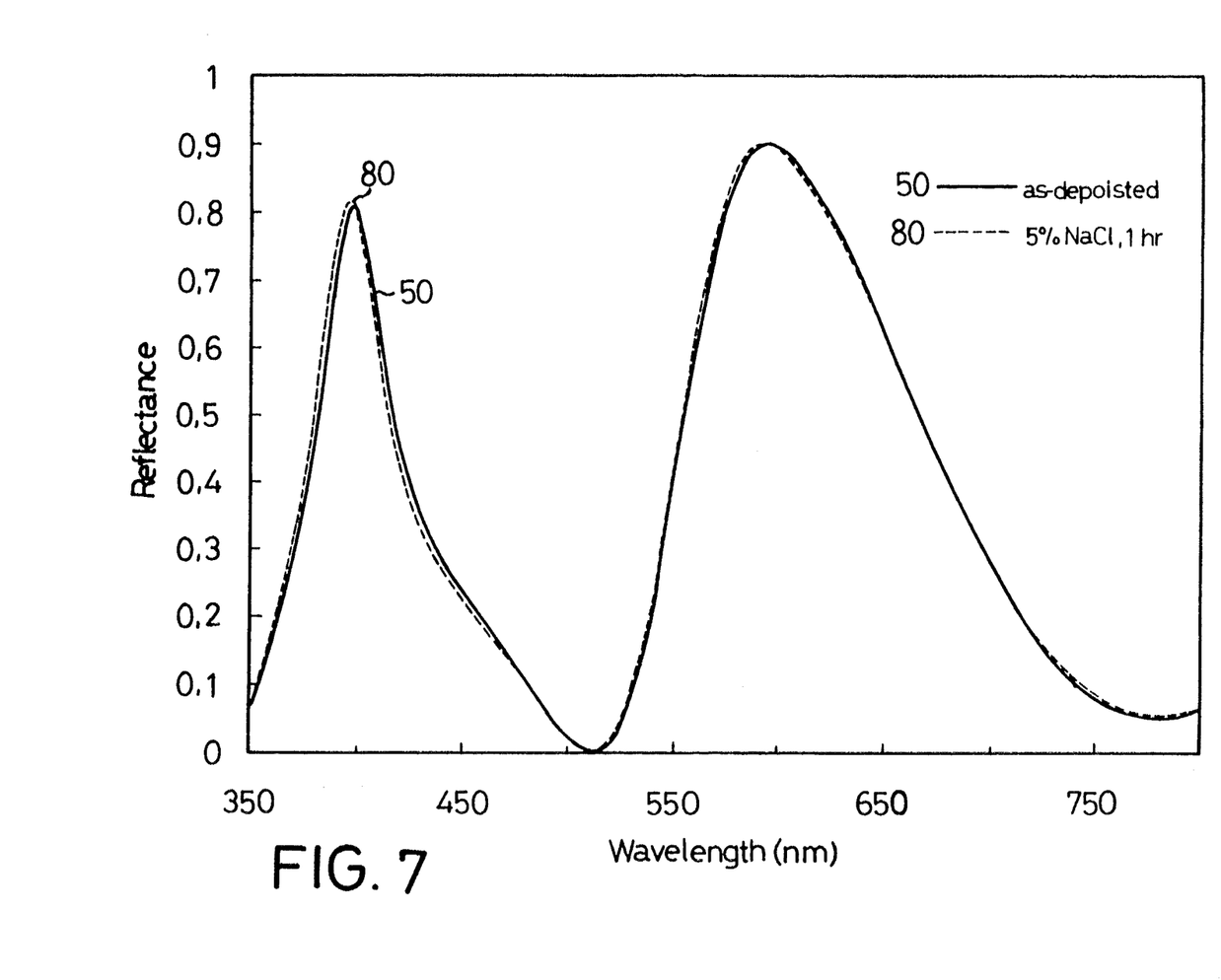
FIG. 7 is the reflection spectra of the optically variable multilayer film (OVM-A) of FIG. 3 with and without the treatment of 5% NaCl solution at a near normal incidence angle.
Figure 8:
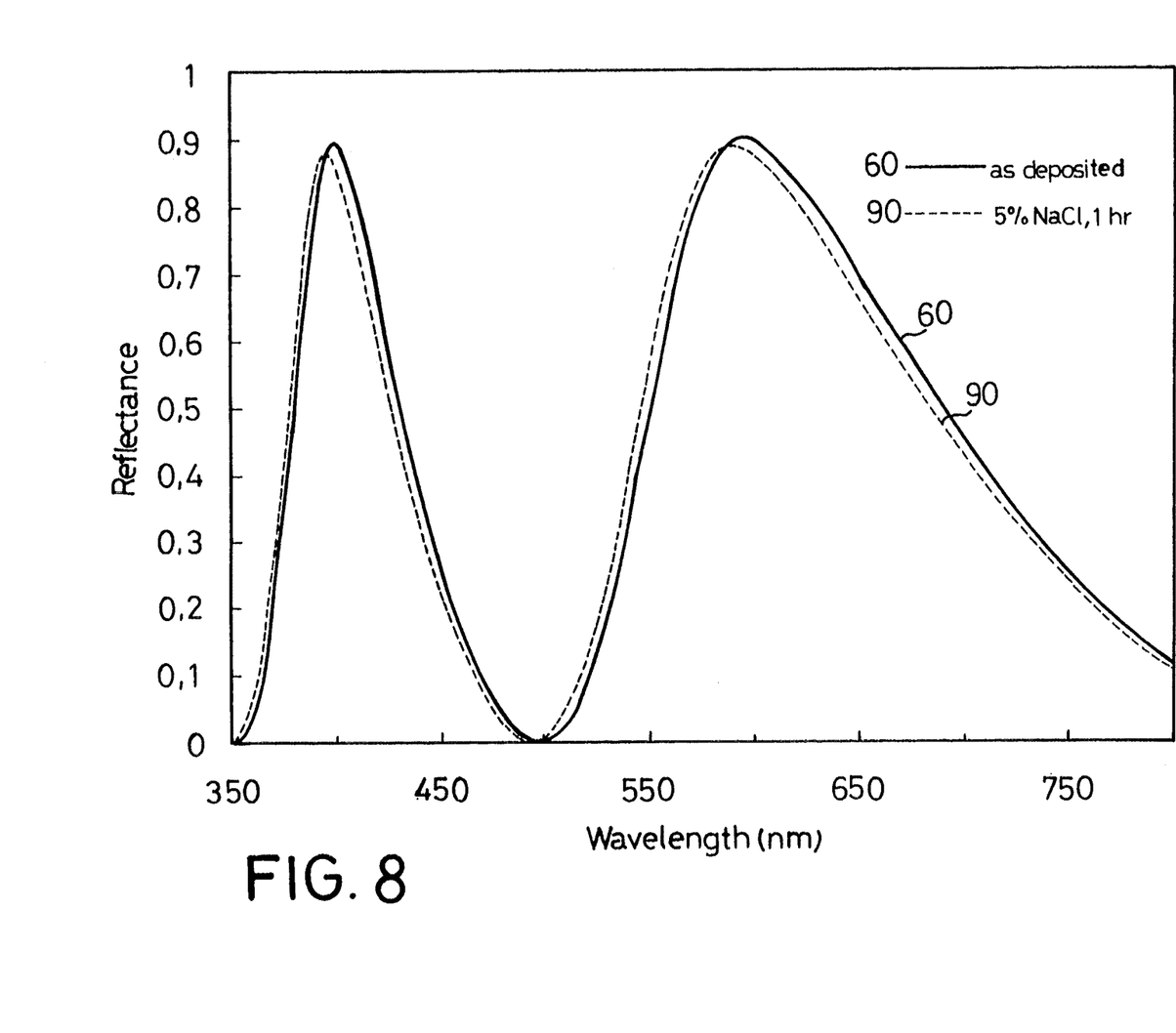
FIG. 8 is the reflection spectra of the conventional optically variable multilayer film (OVM) of FIG. 1 with and without the treatment of 5% NaCl solution at a near normal incidence angle.

FIG. 7 shows the reflection spectra of the near normal incident light of the optically variable multilayer film (OVM-A) of the present invention without the treatment of 5% NaCl solution test (Curve 50) and with the treatment of 5% NaCl solution test (Curve 80). FIG. 8 shows the reflection spectra of the near normal incident light of the conventional optically variable multilayer film (OVM) without the treatment of 5% NaCl solution test (Curve 60) and with the treatment of 5% NaCl solution test (Curve 90). The 5% NaCl solution test is based on the MIL-C-484977-A testing method. The test sample is immersed in a 5% NaCl solution for 1 hour at a boiling temperature. Then the test sample is taken out, cleaned with water and dried with air. In the 5% NaCl solution test, there are small bubbles appeared on the surface of the conventional OVM. However, there are fewer bubbles on the OVM-A of the present invention. As can be seen from the curves of FIGS. 7 and 8 after the 5% NaCl solution test, the reflection spectra at the near normal incident angle of the conventional OVM will shift to shorter wavelength, and the strength of the reflected peak is significantly lower. However, in the present invention, there is no significant shift for curve 80 and the strength of the reflected peak is similar to that without the treatment of 5% NaCl solution (Curve 50). Besides, after the 5% NaCl solution test and cleaning process, it can find that the test sample without the protective layer has a lot of pin holes on the surfaces thereof which will result in the reduction of light reflection and the increase of transmission. This shows that, the $SiO_2$ protective layer D' of the OVM-A has a brine resistivity and a stronger environmental stability.

Figure 9:
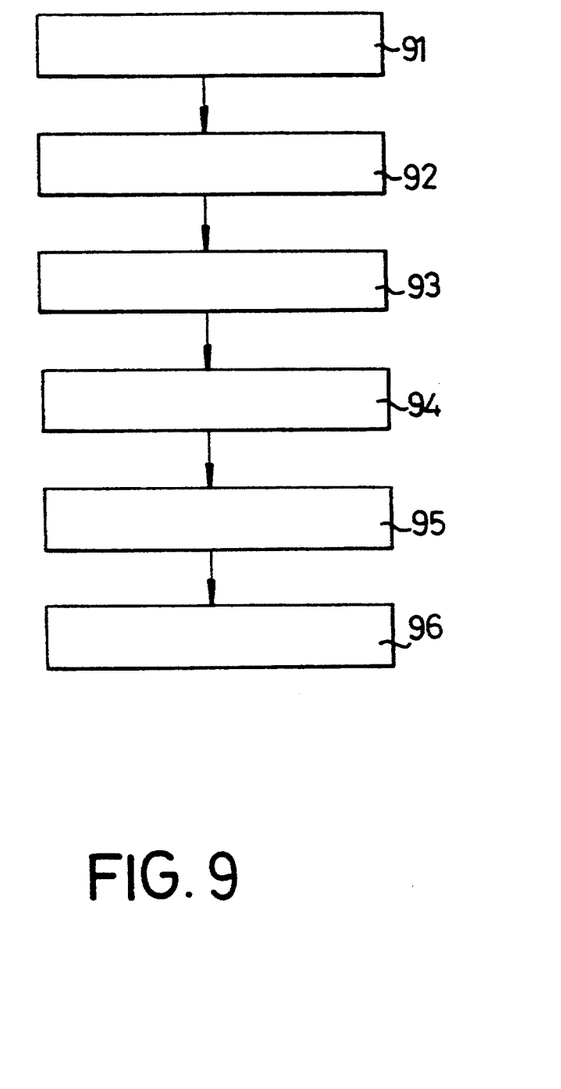
FIG. 9 is the flowchart for the preparation of optically variable multilayer flakes (OVF).

The preparation process of the optically variable multilayer film flakes (OVF) is shown in FIG. 9. Firstly, the thoroughly cleaned flexible PET substrate is fully immersed into a neutral detergent 7553 Extran R MA 02 to deposit the release layer R (step 91). After that, the PET substrate is taken out and dried at an atmosphere for 5 min (step 92) to form the release layer R with smooth and non-sticky characteristics on both surfaces of the PET substrate. The article produced from step 92 is then under a vacuum deposition process to form optically variable multilayer film stacks (step 93). The above deposition step can be achieved by heat resistance, electron beam gun, sputtering or the like. In step 94, the as-deposited film is immersed in water or organic solvent and fractured with an ultrasonic vibrator, such that the release layer R is dissolved in water or organic solvent, and to cause the separation of the optically variable multilayer and PET substrate, and to form flakes suspended or sinked in water or organic solvent. Especially, all the flakes after step 94 still have the constructions of the original multiple layers such that the flakes still remain the original optical characteristics thereof.

After the completion of the above steps, the next step 95 is to use a Centrifugal machine or stand still method to separate the flakes (OVF) from water or organic solution. The OVF is then placed in an oven for drying (temperature 80° C. for 1 hour) to obtain the product of OVF as shown in step 96. The size distribution of the flakes is depended on the used solvent and the time of vibration. As a result, the appropriate solvent and vibration time are selected according to the purpose of application.

Figure 10:
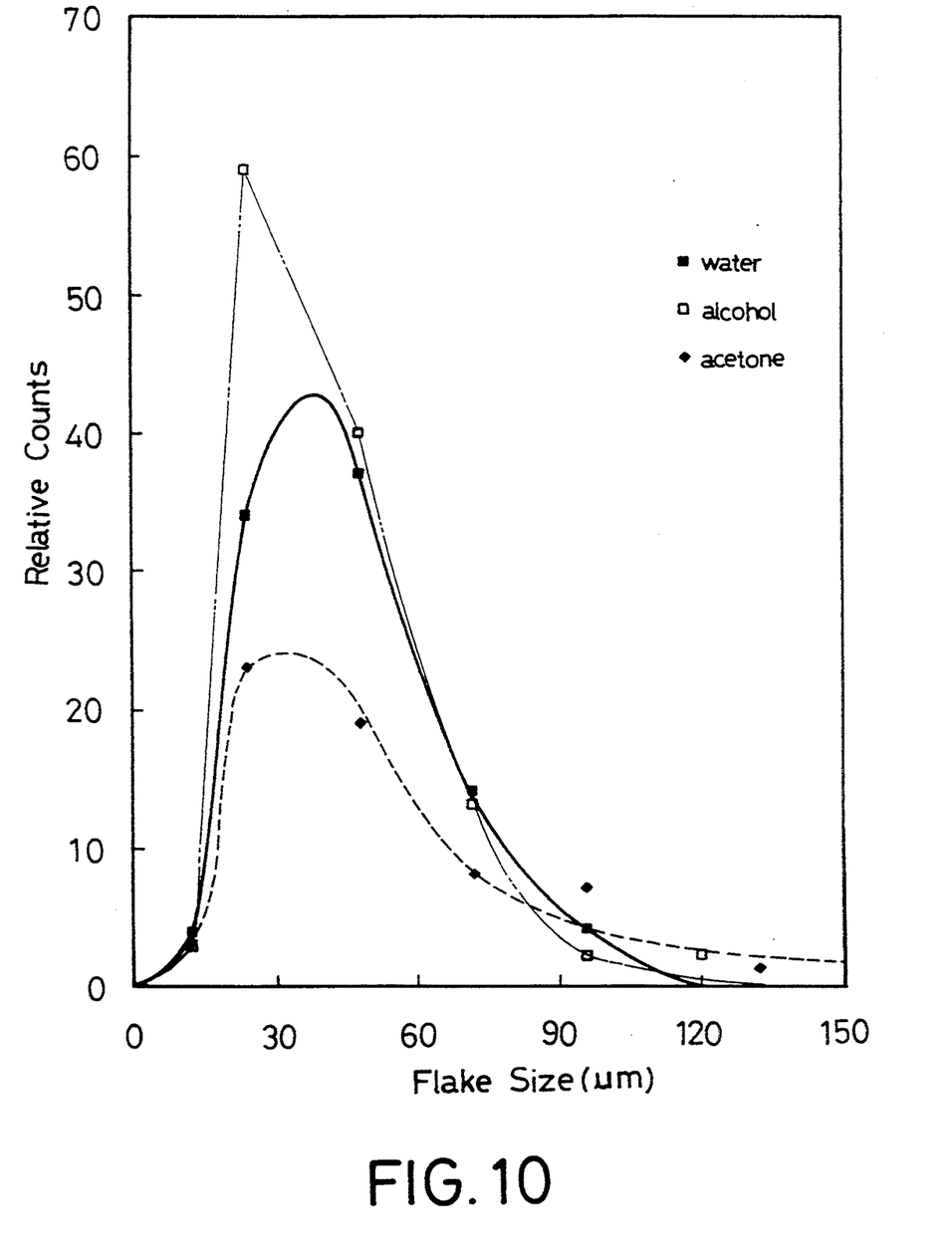
FIG. 10 is the distribution diagram in size of the flakes after fragmentation by an ultrasonic vibration within various types of solvents.

FIG. 10 shows the size distribution of the flakes at different solvent and have been vibrated for half an hour. The vibrator used in the preferred embodiment is an ultrasonic vibrator model typed Bransonic 5200. If alcohol is used as the solvent, the size distribution of OVF is the narrowest, average particle size is the smallest (approximate 40 um); if ketone is used, the size distribution of OVF is the widest, average particle size is the greatest (about 47 um). If water is used, the size distribution of OVF is within the ranges of the above. Due to the fact that water is cheaper than the other two solvents, and it is nontoxic which does not pollute the environment, water is particularly suitable for the making of the flakes. Besides, roller to roller process can be employed in this method. That is, from the step of coating the release layer until the OVF is obtained, all the process can be completed by an automatic production line. Thus, the economic effect of the present invention is enhanced.

In view of the above, it can be seen that the present invention will have the following advantages:

(1) The purity of color of the OVF with the $SiO_2$ protective layer is increased with compared to the conventional OVF without the $SiO_2$ protective layer;

(2) The resistivity against the environment is increased since the $SiO_2$ layer can provide more protection from corrosion of the environmental factors;

(3) The optically variable multilayer film is suitable for mass production because it can be manufactured by a roller to roller process. Therefore, the cost can be reduced; and (4) The OVF of the present invention can be mixed with resin or other varnish to form optically variable paints or printing ink. Such optically variable paints or printing ink can be coated on valuable stocks, vehicles, advertising boards and label for good anti-counterfeiting and decoration purposes.

The embodiments described above are for the purpose of illustration rather than limitation. It is understood that many modifications and variations of the present invention are possible in light of the above teachings. It is therefore to be understood that the invention may be practiced otherwise than as specially described herein and yet remains within the scope of the appended claims.

We claim:

1. An optically variable multilayer film, comprising:
   (1) a metallic reflective layer M';
   (2) two sub-unit multilayer stacks symmetrically mounted onto opposite surfaces of the metallic reflective layer M'; each of the stacks having a structure of D'MD, wherein D' and D are a protective layer and a color-presenting layer, respectively, and both are composed of low refractive index, high hardness, chemically stable silicon dioxide; said protective layer D' further has an optical thickness which is $\frac{1}{4}$ of the wavelength of the desired reflected light; and M is a semi-transparent metallic layer;

said optically variable multilayer film being deposited on a flexible substrate S with a release layer R made of a neutral detergent, soluble in water or a solvent, deposited between said optically variable multilayer film and said flexible substrate S so as to form a structure of S-R-D'-M-D-M'-D-M-D'.

2. An optically variable multilayer film as set forth in claim 1, wherein each of said sub-unit multilayer stacks has a structure of D'MDMD.

3. An optically variable multilayer film as set forth in claim 1, being released from said substrate S by solving said release layer R in water or solvent and being flaked and mixed with resin or varnish to form an optically variable paint or ink.

4. An optically variable multilayer film as set forth in claim 1, wherein said color-presenting layer D has an optical thickness which is an integer times the half wavelength of the desired reflected light.

5. An optically variable multilayer film as set forth in claim 1, wherein each of said protective layer D' and said color-presenting layer D have a refractive index smaller than 1.7.

* * * * *